(12) United States Patent
Pehkonen et al.

(10) Patent No.: US 6,266,321 B1
(45) Date of Patent: Jul. 24, 2001

(54) METHOD FOR TRANSMITTING TWO PARALLEL CHANNELS USING CODE DIVISION AND AN APPARATUS REALIZING THE METHOD

(75) Inventors: Kari Pehkonen; Harri Lilja, both of Oulu (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/086,077

(22) Filed: May 28, 1998

(30) Foreign Application Priority Data

May 29, 1997 (FI) ...................................... 972278

(51) Int. Cl.[7] .................................................. H04J 13/04
(52) U.S. Cl. ........................ 370/206; 370/207; 370/209; 370/335
(58) Field of Search ..................................... 370/320, 335, 370/342, 441; 375/140, 146, 147

(56) References Cited

U.S. PATENT DOCUMENTS

| | | | |
|---|---|---|---|
| 4,973,923 | 11/1990 | Kuisma | 332/117 |
| 5,103,459 | * 4/1992 | Gilhausen et al. | 370/206 |
| 5,124,672 | 6/1992 | Kuisma | 332/103 |
| 5,231,364 | 7/1993 | Mucke | 332/105 |
| 5,311,151 | 5/1994 | Vaisanen | 332/105 |
| 5,357,221 | 10/1994 | Matero | 332/123 |
| 5,371,481 | 12/1994 | Tiittanen et al. | 332/103 |
| 5,392,460 | 2/1995 | Mattila et al. | 455/76 |
| 5,414,728 | 5/1995 | Zehavi | 375/200 |
| 5,446,422 | 8/1995 | Mattila et al. | 332/103 |
| 5,469,126 | 11/1995 | Murtojarvi | 332/105 |
| 5,533,013 | 7/1996 | Leppanen | 370/342 |
| 5,544,167 | * 8/1996 | Lucas et al. | 370/342 |
| 5,598,154 | 1/1997 | Wilson et al. | 341/50 |
| 5,678,224 | 10/1997 | Murtojarvi | 455/326 |
| 5,731,772 | 3/1998 | Mikkola et al. | 341/118 |
| 5,751,761 | * 5/1998 | Gilhausen | 375/146 |

FOREIGN PATENT DOCUMENTS

| | | |
|---|---|---|
| 97837 | 4/1995 | (FI) . |
| WO 96/22639 | 7/1996 | (WO) . |
| WO 98/32263 | 7/1998 | (WO) . |

OTHER PUBLICATIONS

Motorola document entitled "High Speed Data Air Interface" Jan. 15, 1997 (56 pgs).

IEICE Trans, Commun., "Coherent Multicode DS–CDMA Mobile Radio Access", Adachi et al., vol. E79 B No. 9, Sep. 1996, pp. 1316–1325.

* cited by examiner

Primary Examiner—Hassan Kizou
Assistant Examiner—Inder Pal Mehra
(74) Attorney, Agent, or Firm—Perman & Green, LLP

(57) ABSTRACT

To simultaneously transmit data related to two channels using code division data related to a first channel (DTCH) are spread parallely using a first spreading code ($C_I$) and a second spreading code ($C_Q$), data related to a second channel (PCCH) are spread parallely using a first spreading code ($C_I$) and a second spreading code ($C_Q$), the power level of a signal representing said data related to the second channel (PCCH) after the spreading is changed (G) with respect to the power level of a signal representing the data related to the first channel (DTCH) after the spreading, and a transmission is compiled from spread data related to the first channel and spread data related to the second channel the power level of which has been changed.

14 Claims, 7 Drawing Sheets

G = 0

G = 0.5

G = 1

METHOD FOR TRANSMITTING TWO PARALLEL CHANNELS USING CODE DIVISION AND AN APPARATUS REALIZING THE METHOD

BACKGROUND OF THE INVENTION

1. Field of the Invention

The invention relates in general to the transmission of parallel channels in a code division multiple access system. In particular, the invention relates to the transmission of two channels the data communications requirements of which differ from each other as regards e.g. the amount of data transmitted or data integrity.

2. Prior Art

In their operation, terminals, such as mobile phones, in cellular radio systems need to transmit both payload, or user, data and various control data which there are usually considerably less than user data or which have different quality requirements as regards the integrity of transmitted information. Control and user data are transferred in logically separate channels and it is known several methods for multiplexing those channels into a common physical radio-frequency channel. It is usual to arrange the information transmitted by a radio apparatus into frames in which the control data and user data are located in temporally separable frame components, i.e. multiplexed in the time domain. This kind of transmission method is poorly suited to so-called discontinuous transmission (DTX) if the transmission of control data has to be continuous because of the nature of said data. In discontinuous transmission, the transmission of user data is interrupted for the moments when there is no actual information to be sent (e.g., when the user of a mobile phone stops talking during a call). In code division multiple access (CDMA) systems, however, it is usually desirable to maintain the connection by always sending at least some control data; applying DTX requires pulse-type transmission within a frame.

In systems employing code division multiple access it is known to process control data and user data in two different code channels as shown in FIG. 1. At the same time, FIG. 1 also shows other known ways to combine different logic channels in one transmission. The arrangement according to FIG. 1 is known e.g. from patent document FI 97837 which has the same applicant as this patent application. Line 10 represents a transmitted bit stream which is not very error critical but in which a maximum of $10^{-3}$ bit error ratio (BER) is allowed, and line 11 represents an error critical bit stream in which the BER has to be smaller than $10^{-6}$. In order to achieve a better bit error ratio the bit stream of line 11 is Reed-Solomon coded in block 12 and interleaved in block 13. Bit streams from lines 10 and 11 are combined in block 14 and certain tail bits are added to them in block 15 whereafter the resulting combined bit stream is convolution coded in block 16. Line 18, the bit stream of which is not error correction coded nor convolution coded, is then multiplexed in block 17 onto the same code channel. To achieve the desired symbol rate, symbol repetition in block 19 and interleaving in block 20 are used if necessary. Spreading is carried out in a coding element 21 using PN1 code, whereafter the resulting symbol stream is taken to the I branch of a radio-frequency block 22 to produce a radio-frequency transmission together with the lower code channel, to be taken to an antenna 23.

Frame control header (FCH) bits carrying information on the lower code channel are taken via line 24 to a coding block 25 and therefrom via symbol repetition 26 and interleaving 27 to block 28 where reference symbols 29 needed for synchronising the receiver as well as the power control (PC) symbols 30 are added to the symbol stream. A coding element 31 performs spreading using PN2 code, which is different from the aforementioned PN1, whereafter the timing of the lower code channel with respect to the higher one is adjusted suitable by a delay element 32 before the symbol stream is taken to the Q branch of the radio-frequency block 22 to produce a radio-frequency transmission together with the higher code channel, to be taken to an antenna 23. The delay generated by the delay element 32 may also be 0, in which case quadrature phase shift keying (QPSK) modulation is used.

In a radio apparatus according to FIG. 1, it is possible to use on the lower code channel, due to a lower bit rate, a lower power level than on the higher code channel, thus saving electric power. In small-sized cellular radio system terminals, power saving in transmission is advantageous both to lengthen the discharge time of the batteries and to limit the general noise level of the system. However, the arrangement according to FIG. 1 is not optimal from the standpoint of using different power levels because of a power amplifier (not shown) in the radiofrequency block 21 and distortion occurring in it. RF amplifiers do not behave in a linear fashion when operated near the saturation region of the amplifier. Especially in the case of modulation methods with wide amplitude variation the intermodulation products generated in the amplifier should be reduced by operating the amplifier in a so-called backed-off mode, which means the amplifier input power must be decreased compared to the power that would drive the amplifier into saturation. The resulting decrease in output power is called the output back-off (OBO). The bigger the OBO, the poorer the amplifier's efficiency which is calculated as the ratio of RF power produced to DC power consumed. In the arrangement according to FIG. 1, the OBO is proportional to the power difference of the code channels so that decreasing the power level of the lower code channel with respect to the power level of the higher code channel increases the OBO.

OBJECTS OF THE INVENTION

An object of the present invention is to provide a method and apparatus for transmitting two parallel logic channels using code division with an efficiency better than in the prior art.

The objects of the invention are achieved by using for the logic channels two spreading codes and in the radio-frequency part an IQ modulation method wherein the signal of the first branch is produced as the sum of the spread signals of the different channels, and the signal of the second branch is produced as the difference of the spread signals of the different channels.

SUMMARY OF THE INVENTION

The communications device according to the invention is characterised in that it comprises first spreading means for spreading data related to a first channel using a first spreading code, and second spreading means for spreading said data related to the first channel using a second spreading code, third spreading means for spreading data related to a second channel using said first spreading code, and fourth spreading means for spreading said data related to the second channel using said second spreading code, means for changing the power level of said data related to the second channel with respect to the power level of data related to the first channel, and combiner means to compile a transmission from spread data related to the first channel and spread data related to the second channel the gain of which has been changed.

The invention is also directed to a communications system in which at least one transmitter apparatus meets the characteristics listed above.

The invention is further directed to a transmission method characterised in that data related to a first channel are spread in parallel using a first spreading code and a second spreading code, data related to a second channel are spread in parallel using said first spreading code and said second spreading code, the power level of said data related to the second channel is changed with respect to the power level of the data related to the first channel, and a transmission is compiled from spread data related to the first channel and spread data related to the second channel the gain of which has been changed.

The method according to the invention for coding two channels uses two spreading codes such that the bit streams of both channels are spread separately using a first code and a second code. The first channel spread with the first code and the second channel spread with the second code are subtracted from each other, and the first channel spread with the second code and the second channel spread with the first code are added up. Prior to said summing and subtraction operations the spread forms of the second channel are multiplied by a power correction factor which is a real number coefficient greater than zero. Signals obtained from the summing and subtraction operations are taken to the branches of an IQ type radio-frequency part, and the signals obtained from the branches are summed and taken to an antenna to be transmitted. Prior to the coding with said first and second codes the bit streams of the channels may be separately coded using e.g. so-called short codes so that the short codes function as spreading codes proper and the first and second codes can be used for signal scranbling. Other known operations, such as interleaving, error correction coding and grouping, may also be imposed on the bit streams.

DESCRIPTION OF THE DRAWINGS

The invention is described in more detail with reference to the preferred embodiments presented by way of example and to the attached drawing wherein.

DETAILED DESCRIPTION OF THE PREFERRED EMBODIMENT(S)

Figure 1:
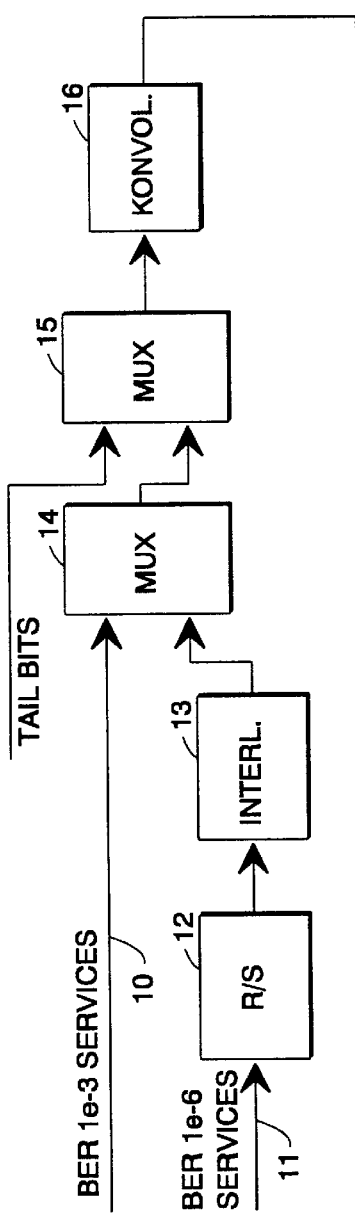
FIG. 1 shows a prior-art arrangement for transmitting different channels.
Figure 1:
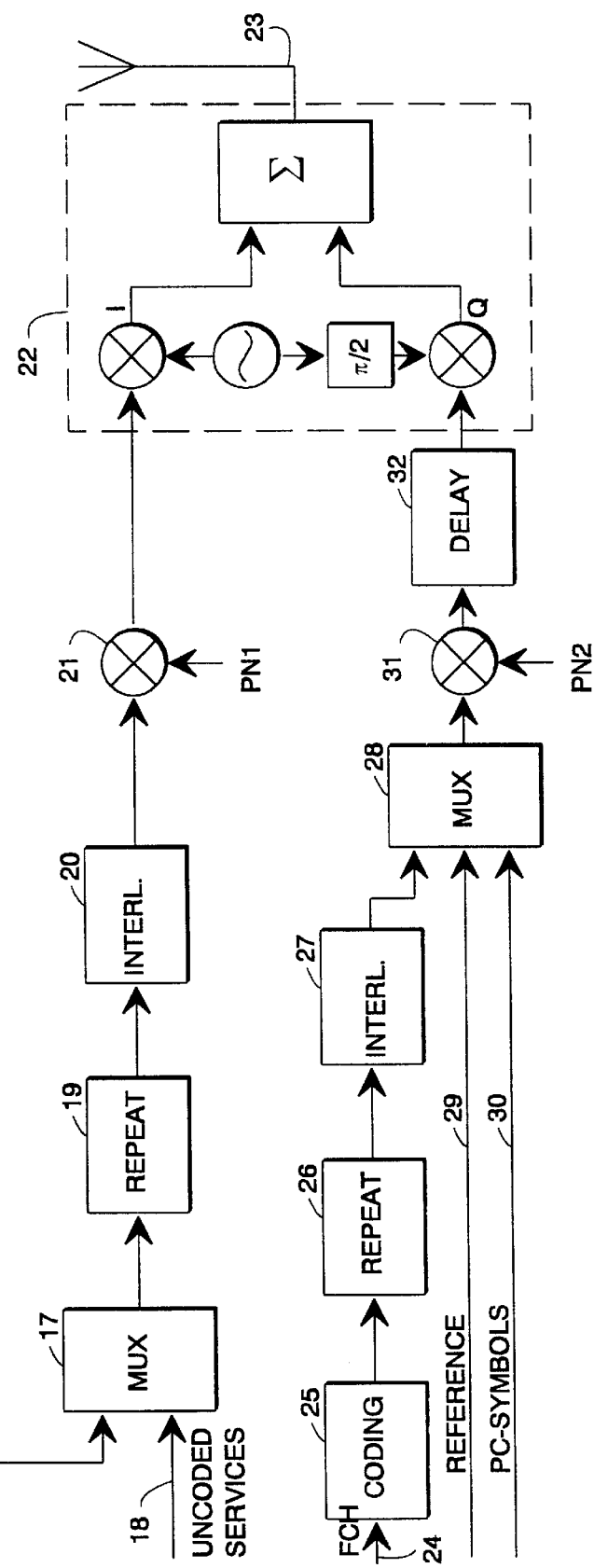

Above in conjunction with the description of the prior art reference was made to FIG. 1, so below in the description of the invention and its preferred embodiments reference will be made mainly to FIGS. 2a through 6. Like elements in the Figures are denoted by like reference designators.

Figure 2A:
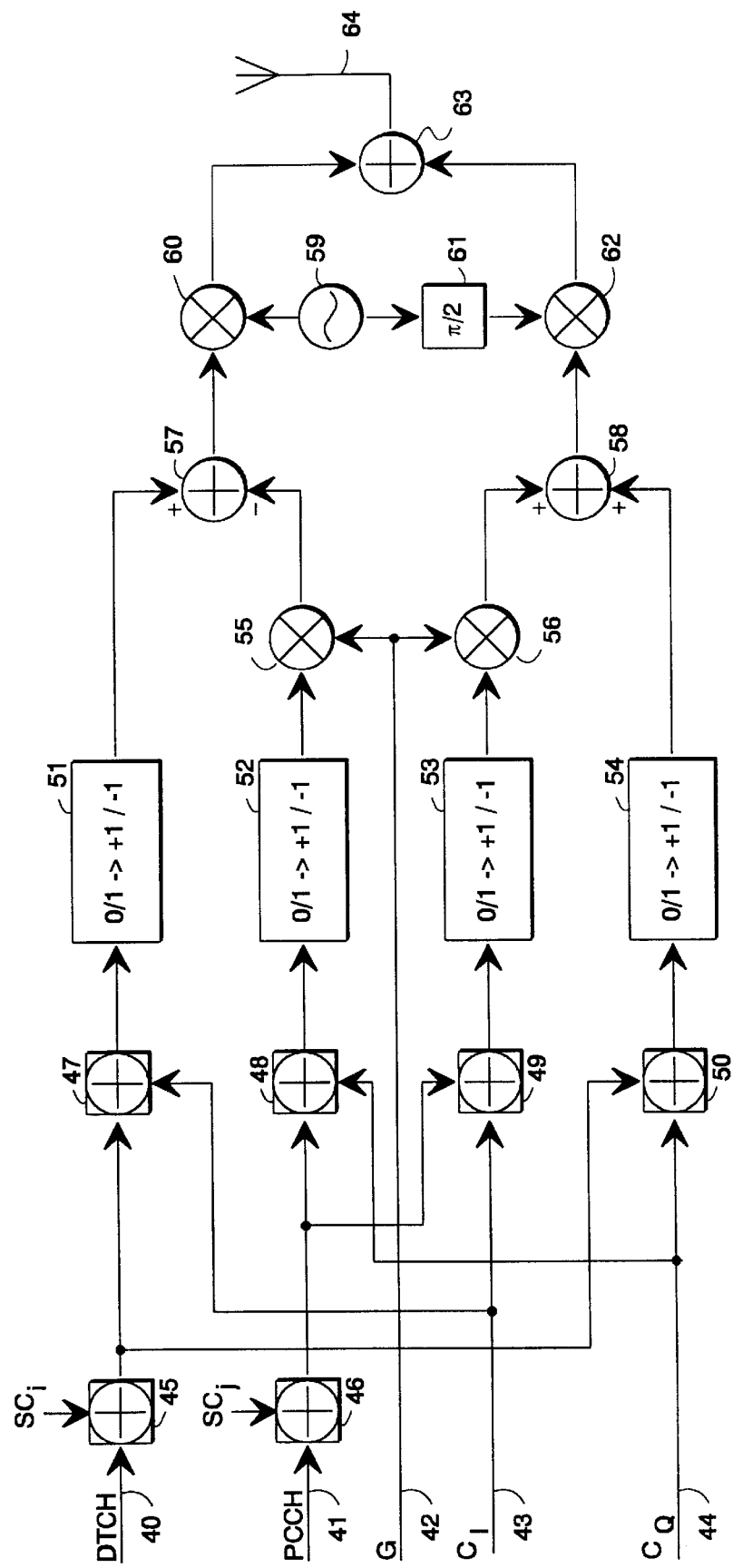
FIGS. 2a and 2b show arrangements according to the invention for transmitting different channels.
Figure 2B:
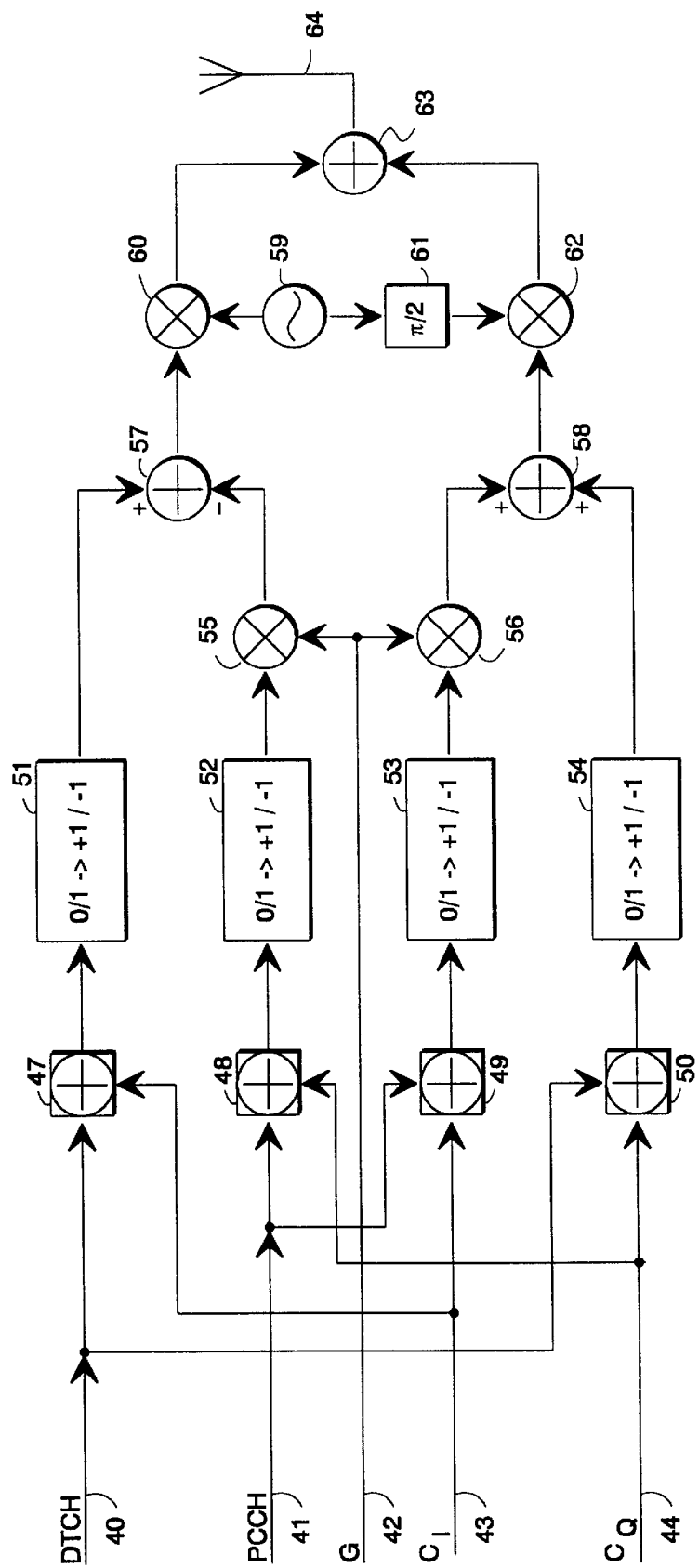

FIGS. 2a and 2b show two mutually alternative arrangements according to the invention for transmitting two parallel channels using code division. In this example, a first channel contains user data and a second channel contains control data. The first channel is called a dedicated traffic channel (DTCH) and the second channel, a physical control channel (PCCH). Names of the channels are exemplary only and do not confine the application of the invention to any particular communications system. For the invention, it is irrelevant what kind of information is transmitted on the channels or how the data transfer requirements of the different channels differ from each other. The invention allows dynamic changing of differences between the channels during the operation of the system.

The bit stream of the DTCH channel is taken to the arrangement according to the invention through line 40 and the bit stream of the PCCH channel through line 41. Line 42 represents a gain factor G, the meaning of which will be discussed later on. A first code, represented by symbol $C_I$, is taken to the arrangement through line 43, and a second code, represented by symbol $C_Q$, is taken to the arrangement through line 44. Codes $C_I$ and $C_Q$ can be e.g. long Gold codes, which are known as such and the use of which is known to one skilled in the art e.g. from the document "Coherent Multicode DS-CDMA Mobile Radio Access" by Adachi et al., IEICE Trans. Commun. Vol. E79 B. No 9, September 1996, pp. 1316–1325.

FIG. 2a shows the spreading of both the DTCH and the PCCH channel using a separate so-called short code prior to other operations related to the coding and modulation. In block 45, the bit stream of the DTCH channel is spread with a short code $SC_i$ and in block 46, the bit stream of the PCCH channel is spread with a short code $SC_j$. It should be noted that the speed of the bit stream on the PCCH channel in bits per second is generally lower than the speed of the bit stream on the DTCH channel. If the symbol streams generated from both bit streams in blocks 45 and 46 have identical symbol rates, the so-called processing gain in block 46 can be higher, i.e. it can employ more symbols per bit stream bit than block 45.

Separate spreading as such according to blocks 45 and 46 is not essential for the invention. However, use of spreading brings certain advantages in arranging multiple access in a cellular radio system. When using a transmission arrangement according to FIG. 2a in terminals of a cellular radio system, each terminal can be assigned short codes from among mutually orthogonal or non-orthogonal codes to distinguish between the parallel code channels transmitted by the terminal. In addition, each terminal needs a short or long code of its own so that a base station receiver can distinguish between signals sent by different terminals.

Correspondingly, in downlink transmission each base station can have long codes of its own so that signals sent to terminals within a cell are distinguished using different short codes. Associating short codes with blocks 45 and 46 does not limit the invention but also long codes can be used in the spreading represented by these blocks.

The symbol stream generated in block 45 from the bit stream on the DTCH channel is taken to two parallel branches and further to blocks 47 and 50. If the bit stream on the DTCH channel is spread as shown in block 45 of FIG. 2a, the operations performed on the symbol stream with codes $C_I$ and $C_Q$ in blocks 47 and 50 are called scrambling.

Scrambling can be considered a special case of spreading in which the bandwidth used does not grow any more but in which the data contents of the symbol stream scrambled are divided pseudo-randomly in a manner determined by the (spreading) code used. If spreading according to blocks 45 and 46 is not used, the bit stream of the DTCH channel is taken to blocks 47 and 50 as shown in FIG. 2b and spread in block 47 with code $C_I$ and in block 50 with code $C_Q$. Correspondingly, the PCCH channel bit stream or the symbol stream generated from it in block 46 is taken to two parallel branches in which the bit stream is spread or the symbol stream is scrambled in block 48 with code $C_Q$ and in block 49 with code $C_I$.

Blocks 51, 52, 53 and 54 perform a non-return-to-zero conversion (a phase modulation method) between the bit values included in the symbols generated in the spreading and the corresponding positive or negative values. In multipliers 55 and 56, the signals carrying the PCCH channel data are multiplied by a gain factor G, whereafter signals to be taken to the I and Q branches of the radio-frequency part are generated in adders 57 and 58. The signal taken to the I branch is the difference of the DTCH channel spread with code $C_I$ (or spread with code $SC_i$ and scrambled with code $C_I$) and PCCH channel spread with code $C_Q$ (or spread with code $SC_j$ and scrambled with code $C_Q$), where the latter is multiplied with the gain factor G. Correspondingly, the signal taken to the Q branch is the sum of the DTCH channel spread with code $C_Q$ (or spread with code $SC_i$ and scrambled with code CQ) and PCCH channel spread with code $C_I$ (or spread with code $SQ_j$ and scrambled with code $C_I$), where the latter is multiplied with the gain factor G. The IQ modulation performed in the radio-frequency part by means of a local oscillator 59, multiplier 60, phase shifter 61 and multiplier 62 is in accordance with the prior art. The I and Q branch signals are combined in an adder 63 and taken to an antenna 64 for transmission.

Multiplying the symbol streams generated from the PCCH channel by a gain factor G unequal to one produces a power difference between the DTCH and PCCH channels. If the gain factor G is between zero and one, the processing gain imposed earlier on in block 46 on the PCCH channel higher than on the DTCH channel, and decreasing of power by gain factor G in blocks 55 and 56 cancel each other out, which means that in the whole arrangement the probable bit error ratio of the PCCH channel remains unchanged even if the power of the channel is reduced by gain factor G. Assuming that the PCCH channel bit stream speed remains constant, the processing gain in block 46 must also remain constant for the symbol rate of the symbol stream generated from the PCCH channel to be the same as on the DTCH channel. Then, however, the gain factor G of the PCCH channel can be used to alter the bit error ratio; if, e.g., it is measured that the bit error ratio in a connection between the transmitting and receiving radio apparatus is too high, the receiving apparatus can request the transmitting apparatus to increase the gain factor G to reduce the bit error ratio. If the bit stream speed on the PCCH channel varies, the communication characteristics on the PCCH channel can be modified in a versatile manner by selecting the processing gain and gain factor G as desired.

For simplicity, FIGS. 2a and 2b do not show any transmitter amplifiers and filters that do not affect the modulation process proper. However, the use and placement of amplifiers and filters in a transmitter apparatus producing code division transmission is generally known so that a person skilled in the art can easily complete the block diagrams of FIGS. 2a and 2b where required. The spread coding elements, modulating elements, multipliers, adders, oscillator and phase shifter shown in FIGS. 2a and 2b are radio-frequency parts which as such are known to one skilled in the art. In FIGS. 2a and 2b, the roles of the adders 57 and 58 are interchangeable, i.e. adder 57 can calculate the sum of the signals brought to it and adder 58 can calculate the difference of the signals brought to it, which as such does not affect the inventional idea realised by the apparatus.

Figure 3A:
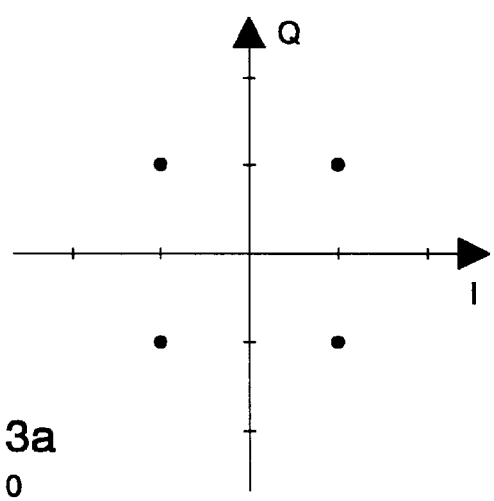
FIGS. 3a to 3c show constellation points produced by the arrangement according to FIG. 2a or 2b.
Figure 3B:
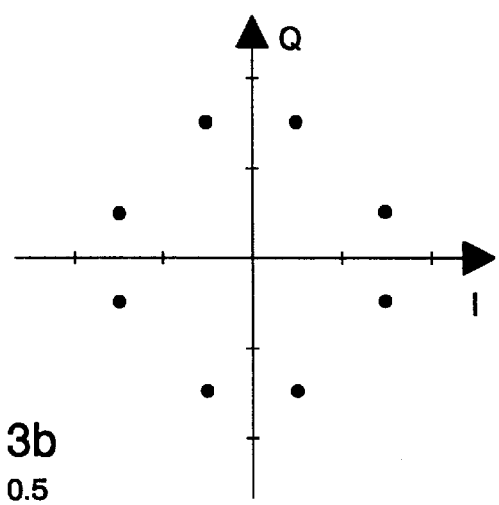
Figure 3C:
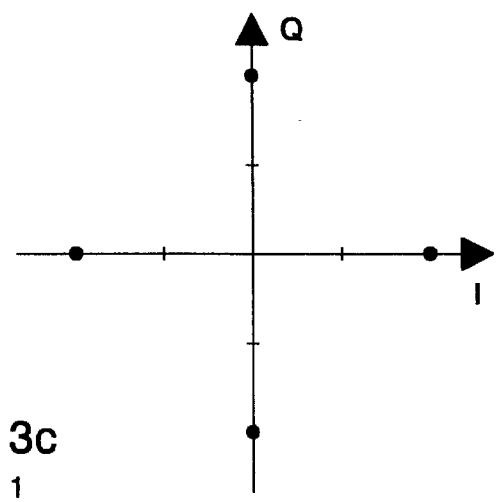

FIGS. 3a, 3b and 3c illustrate constellation points of a phase-modulated radio signal generated by the arrangement according to FIG. 2a or 2b, i.e. possible end points of a vector representing the signal and starting from the origin of an IQ system of coordinates with values 0 (FIG. 3a), 0.5 (FIG. 3b) and 1 (FIG. 3c) for the gain factor G. The scales of the I and Q axes are suggestive and represent relative power such that each interval between the scale marks represents the power level of one channel (say, the DTCH channel). The coordinates of the constellation points are generally (1+G, 1−G), (1−G, 1+G), (−1+G, 1+G), (−1−G, 1−G), (−1−G, −1+G), (−1+G, 1−G), (1−G, −1+G) and (1+G, −1+G), when the power level of one channel is denoted by 1. In FIG. 3a, the gain factor G has the value 0 so that the signal is formed solely on the basis of the DTCH channel. Constellation points are reduced to four points which are (1, 1), (−1, 1), (−1, −1) and (1, −1). When the value of the gain factor G starts to grow from zero toward one, each constellation point in the graph of FIG. 3a is divided into two constellation points that are located in the same quadrant symmetrically with respect to a diagonal intersecting the origin and the further away from each other the higher the value of the gain factor G. In FIG. 3b, the gain factor G has the value 0.5. When the gain factor G becomes 1 the constellation points are again reduced in accordance with FIG. 3c to four points which are (2, 0), (0, 2), (−2, 0) and (0, −2).

The logic for determining the location of the constellation points can easily be generalised to apply to a situation wherein the value of the gain factor G is greater than one. FIG. 3b can be understood such that it depicts the location of constellation points generally in a situation in which there is a power difference between the signals representing the data related to the different channels. Then the channel with the lower relative power replaces the PCCH channel in the logic described above and the channel with the higher relative power replaces the DTCH channel.

In the arrangement according to the invention, the ratio of transmitter peak power to the average power remains almost constant regardless of the power difference between the channels. In the method according to the prior art (cf. FIG. 1) the ratio of the peak power to the average power increases as the power difference increases so that the average power of the transmitter must be decreased lest components transmitted at peak power become distorted because of saturation of transmitter power amplifier. This makes efficiency poorer.

Figure 4:
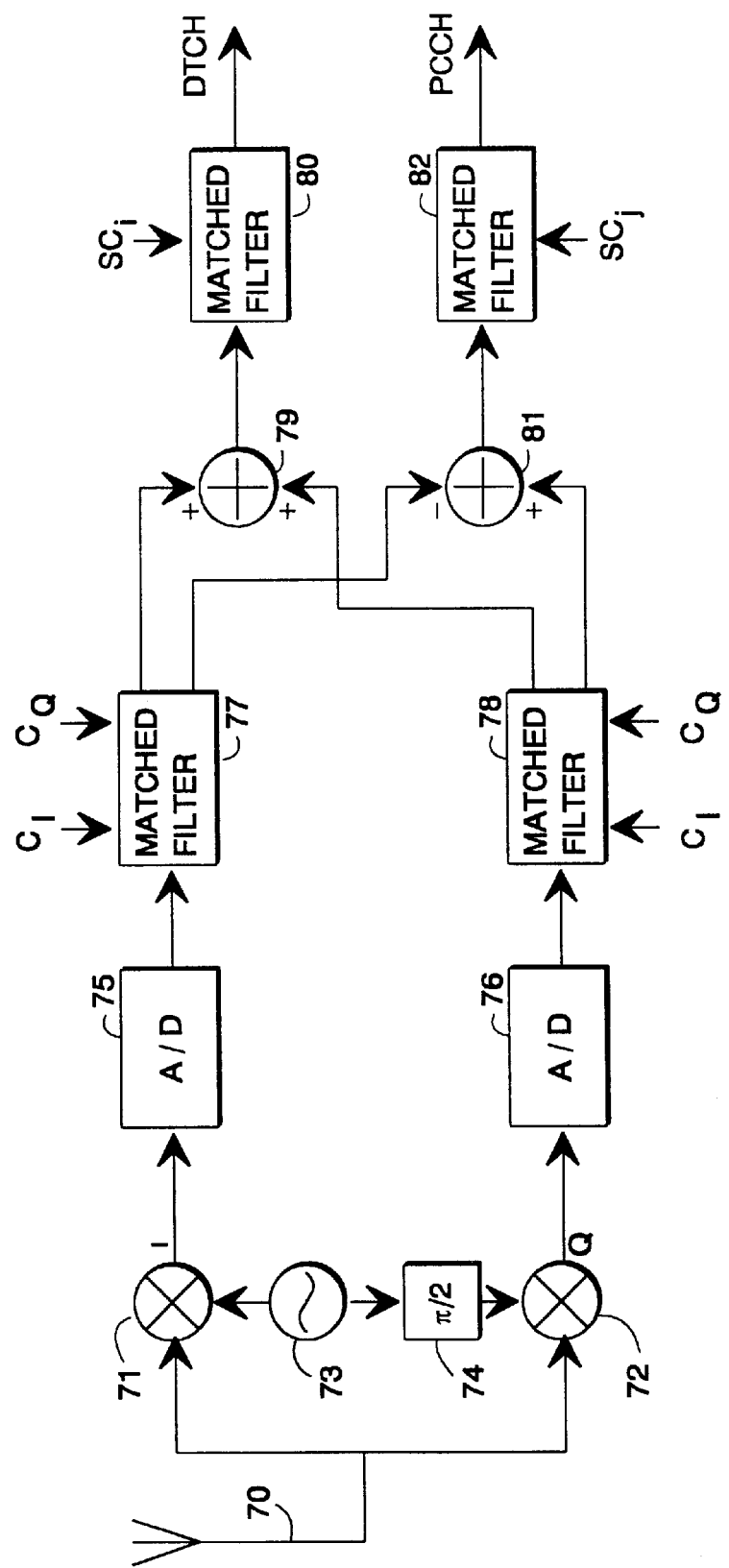
FIG. 4 shows an arrangement for receiving a signal formed in the manner according to FIG. 2a, FIG. 5 shows the arrangements according to FIGS. 2a or 2b and 4 within a cellular radio system.

FIG. 4 is a simple block diagram of a receiver that can be used to receive, demodulate and decode a transmission produced by a transmitter according to FIG. 2a. A radio signal received by an antenna 70 is taken to I and Q branches in the receiver where it is down-converted by means of mixers 71 and 72 as well as local oscillator 73 and 90-degree phase shifter 74. The resulting signals are A/D converted in blocks 75 and 76, thus producing two parallel symbol streams. For despreading the symbol streams are taken to matched filters or correlators 77 and 78, both of which get as input the long spreading codes $C_I$ and $C_Q$ used by the transmitter. The symbol stream decoded with code $C_I$ in a first matched filter 77 and the symbol stream decoded with code $C_Q$ in a second matched filter 78 are summed in an adder 79, producing a DTCH channel symbol stream which is taken to a matched filter 80 to remove the spreading according to the short code $SC_i$. Correspondingly, adder 81 calculates the difference of the symbol stream decoded with code $C_Q$ in the first matched filter 77 and the symbol stream decoded with code $C_I$ in the second matched filter 78, producing a PCCH channel symbol stream which is taken to a matched filter 82 to remove the spreading according to the short code $SC_j$.

The block diagram shown in FIG. 4 corresponds to that shown in FIG. 2a in that FIG. 4 does not show the transmitters and filters which as such are obvious to a person skilled in the art and which are of no significance to the demodulation and decoding process proper. If the transmitter is in accordance with FIG. 2b, i.e. it does not employ bit stream spreading before the bit streams are divided into two branches, blocks 80 and 82 can be left out of the receiver depicted in FIG. 4.

Figure 5:
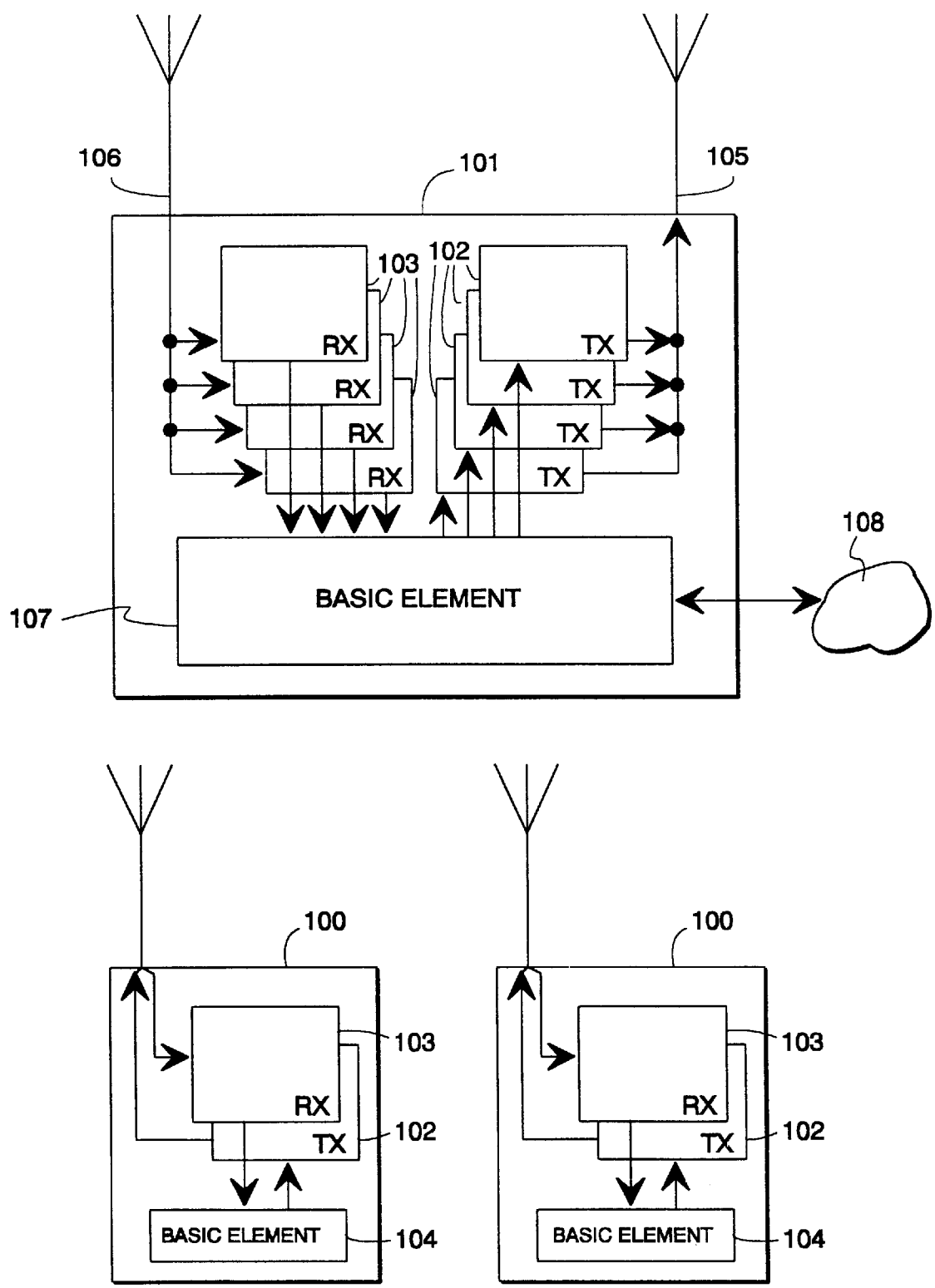

FIG. 5 shows an exemplary arrangement of transmitters and receivers according to the invention in a cellular radio system comprising terminals 100 and base stations 101. A terminal includes at least one transmitter 102 according to the invention and at least one receiver 103 according to the invention and a basic element 104 which in a terminal such as a mobile phone includes known functions such as audio signal conversion to digital form, transmitter branch channel encoding, receive branch channel decoding and conversion of received digital signal into an audio signal as well as a control block and the necessary memory and user interface functions used for controlling the operation of the terminal. A base station 101 may include combined transmitter and receiver apparatuses employing complex spreading according to the invention and QPSK modulation and combining in different ways processing of signals related to several simultaneous connections. FIG. 5 shows a base station 101 having one common transmission antenna 105 and one common reception antenna 106 to which it is coupled several transmitter apparatuses 102 and receiver apparatuses 103 according to FIGS. 2 and 4. Above it was discussed the use of different spreading codes in a terminal and base stations to distinguish between simultaneous radio connections. The base station 101 also has a basic element 107 which comprises known functions for generating bit streams sent to users, processing bit streams received from users, managing the two-way communications between the base station and the rest of the communications network 108 as well as for controlling the operation of the base station 101.

Figure 6:
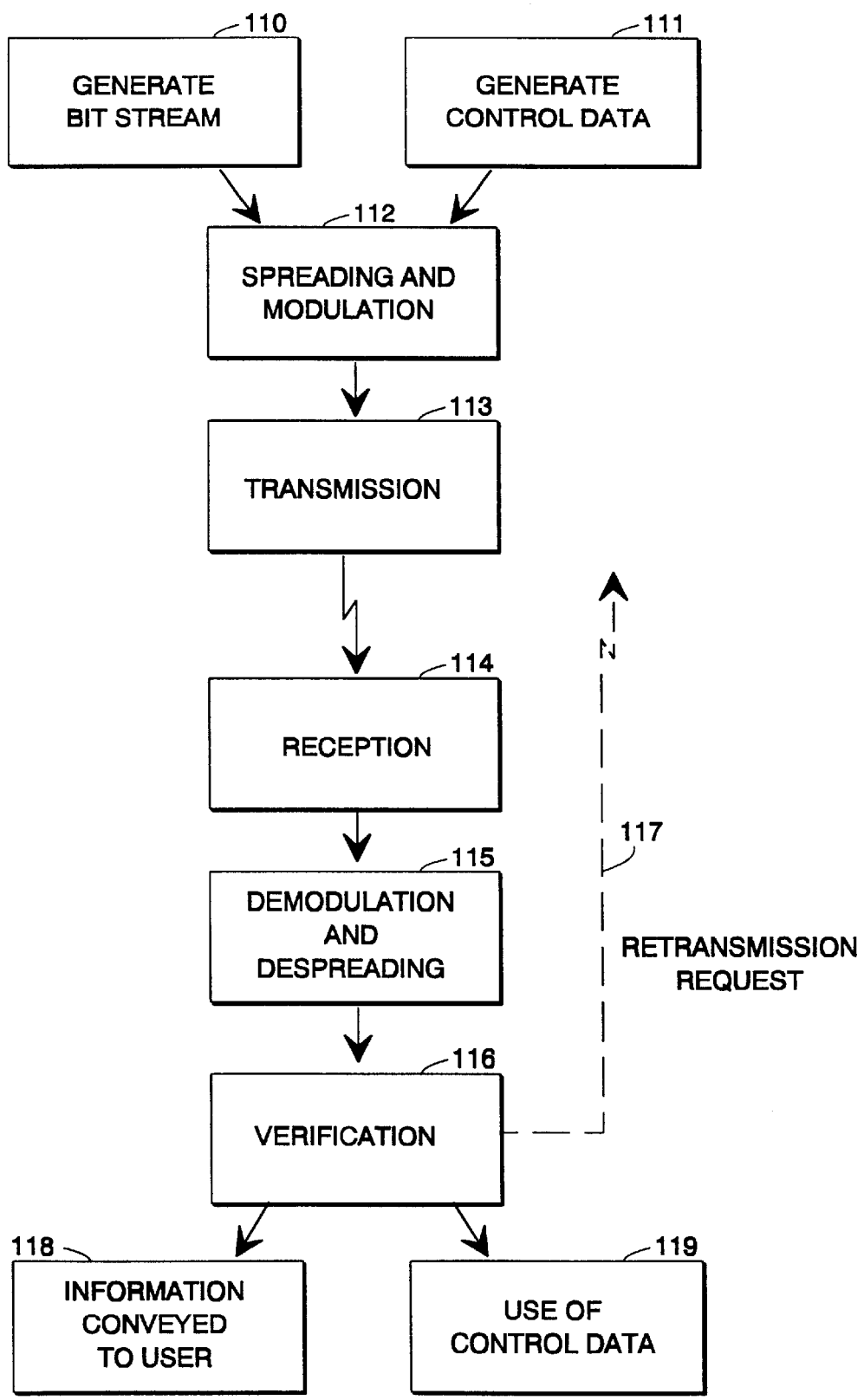
FIG. 6 shows in the form of a flow diagram a preferred embodiment of the method according to the invention.

FIG. 6 illustrates an advantageous method for generating a radio transmission in the manner according to the invention and for receiving it. Step 110 comprises the generation of a bit stream to be transmitted. The bit stream may represent voice, pictures, data or a combination of those, and it is generated in a known manner. In step 111, control data are generated for the transmission; the PCCH channel discussed above provides an example of this. Step 112 comprises complex spreading and QPSK modulation according to FIG. 2 using a gain factor G in the control data processing. In step 113 the transmitter apparatus transmits the radio-frequency signal generated and in step 114 the receiver apparatus receives it. Step 115 comprises signal demodulation and despreading in accordance with FIG. 4. In step 116, the integrity of the received data is verified in a known manner, e.g. using checksum calculation, and, if necessary, a retransmission request 117 is sent to the transmitter apparatus. The request may also be accompanied by an instruction to increase the gain factor G used by the transmitter apparatus or otherwise improve the chances of error-free reception of the signal. In step 118, the information conveyed in the form of bit stream is made available to the user e.g. as sound or pictures, and in step 119 the control data are utilised in the operation of the receiving apparatus.

The arrangements according to FIGS. 5 and 6 can employ discontinuous transmission wherein a mobile phone, for example, functioning as a terminal 100 will not send user data formed on the basis of the audio signal when a connection exists but the user is silent. However, to ensure uninterrupted transmission of control data it continuously sends PCCH channel information. Then the transmitter of the terminal need not be continually switched on and off, thus eliminating glitches in the transmitter as well as radio-frequency interference around the terminal. It is also easier for the receiver in the base station to stay synchronised to the received radio transmission if the connection is not intermittently cut off because of the pulse-like nature of the transmission. Simulations have proved that the OBO of the power amplifier in the transmitting radio apparatus in the arrangement according to the invention is nearly independent of the power difference of the DTCH and PCCH channels at least with power difference values from zero to nine decibels, so the efficiency of the transmitter power amplifier remains good even with a power difference of one decade between the channels.

The transmission arrangement according to the invention may in one embodiment comprise two parallel gain factors, the first of which is used to adjust the relative power level of a signal representing data related to a first channel, and the second of which is used to adjust the relative power level of a signal representing data related to a second channel. In an arrangement realised using one gain factor, the gain factor can also be used to multiply the signal representing data related to the first channel instead of the arrangement described above where the signal representing data related to the second channel is multiplied by the gain factor. In the block diagrams shown in FIGS. 2a and 2b this would mean that multipliers 55 and 56 would be placed between blocks 51 and 57 and blocks 54 and 58. Then there would be a direct connection from block 52 to block 57 and direct connection from block 53 to block 58, and between blocks 51 and 57 and blocks 54 and 58 there would be a multiplier in which the signals coming from blocks 51 and 54 would be multiplied by a gain factor G.

What is claimed is:

1. A communications device for the simultaneous transmission of data related to a first channel and data related to a second channel using code division, comprising:

first spreading means for spreading data related to the first channel using a predetermined first spreading code, second spreading means for spreading said data related to the first channel using a predetermined second spreading code, third spreading means for spreading data related to the second channel using said first spreading code, fourth spreading means for spreading said data related to the second channel using said second spreading code, means for changing the power level of a signal representing the data related to the second channel after the spreading with respect to the power level of a signal representing the data related to the first channel after the spreading, and combiner means to compile a transmission from spread data related to the first channel and spread data related to the second channel the power level of which has been changed, said combiner means comprising:

means for calculating the difference between data related to a first channel spread with a first spreading code, and data related to a second channel, spread with a second spreading code and the power level of which has been changed, and means for calculating the sum of data related to the first channel, spread with the second spreading code, and data related to the second channel, spread with the first spreading code and the power level of which has been changed.

2. The communications device of claim 1, wherein said combiner means further comprises:

first adding means for calculating the difference between data related to a first channel, spread with a first spreading code, and data related to a second channel, spread with a second spreading code and the power level of which has been changed, a first mixer to multiply said difference by a certain first oscillation signal, second adding means for calculating the sum of data related to the first channel, spread with the second spreading code, and data related to the second channel, spread with the first spreading code and the power level of which has been changed, a phase shifter to generate a second oscillation signal from said first oscillation signal by performing a 90-degree phase shift, a second mixer to multiply said sum by said second oscillation signal, and combining means to combine a signal produced by said first mixer and a signal produced by said second mixer.

3. The communications device of claim 1, further comprising fifth spreading means for spreading said data related to the first channel using a predetermined third spreading code before said data related to the first channel are spread using other spreading codes, and sixth spreading means for spreading said data related to the second channel using a predetermined fourth spreading code before said data related to the second channel are spread using other spreading codes.

4. The communications device of claim 1, further comprising means, within said means for changing the power level of a signal, for providing a gain factor to adjust the relative power level of a signal representing data related to the second channel.

5. The communications device of claim 1, further comprising means, within said means for changing the power level of a signal, for providing a gain factor to adjust the relative power level of a signal representing data related to the first channel.

6. The communications device of claim 1, further comprising means, within said means for changing the power level of a signal, for providing two parallel gain factors, the first of which is to adjust the relative power level of a signal representing data related to the first channel, and the second of which is to adjust the relative power level of a signal representing data related to the second channel.

7. A radio communications system for transferring data between terminals and a base station on a multitude of channels using code division, wherein each terminal and each base station comprises at least one transmitter and at least one receiver, said radio communications system comprising within at least one transmitter first spreading means for spreading data related to a first channel using a predetermined first spreading code, second spreading means for spreading said data related to the first channel using a predetermined second spreading code, third spreading means for spreading data related to a second channel using said first spreading code, fourth spreading means for spreading said data related to the second channel using said second spreading code, means for changing the power level of said data related to the second channel with respect to the power level of data related to the first channel, and combiner means to compile a transmission from spread data related to the first channel and spread data related to the second channel the power level of which has been changed, said combiner means comprising:

means for calculating the difference between data related to a first channel, spread with a first spreading code, and data related to a second channel, spread with a second spreading code and the power level of which has been changed, and means for calculating the sum of data related to the first channel, spread with the second spreading code, and data related to the second channel, spread with the first spreading code and the power level of which has been changed.

8. A method for simultaneously transmitting data related to two channels using code division, comprising the steps of:

spreading data related to a first channel in parallel using a first spreading code and a second spreading code, spreading data related to a second channel in parallel using said first spreading code and said second spreading code, changing the power level of said data related to the second channel with respect to the power level of the data related to the first channel, and compiling a transmission from spread data related to the first channel and spread data related to the second channel the power level of which has been changed, said compiling step comprising the substeps of:

calculating the difference between data related to a first channel, spread with a first spreading code, and data related to a second channel, spread with a second spreading code and the power level of which has been changed, and calculating the sum of data related to the first channel, spread with the second spreading code, and data related to the second channel, spread with the first spreading code and the power level of which has been changed.

9. The method of claim 8, wherein the step of compiling a transmission further comprises the substeps of:

calculating the difference between the data related to the first channel, spread with the first spreading code, and the data related to the second channel, spread with the second spreading code, the power level of which has been changed, multiplying said difference by a certain first oscillation signal, calculating the sum of the data related to the first channel, spread with the second spreading code, and the data related to the second channel, spread with the first spreading code, the power level of which has been changed, generating a second oscillation signal from said first oscillation signal by performing a 90-degree phase shift, multiplying said sum by said second oscillation signal, and combining said difference multiplied by the first oscillation signal and said sum multiplied by the second oscillation signal.

10. The method of claim 8, wherein said data related to the first channel are spread using a predetermined third spreading code before they are spread using other spreading codes, and said data related to the second channel are spread using a predetermined fourth spreading code before they are spread using other spreading codes.

11. The method of claim 8, wherein, for changing the power level of said data related to the second channel with respect to the power level of the data related to the first channel, the relative power level of a signal representing data related to the second channel is adjusted by a gain factor.

12. The method of claim 8, wherein, for changing the power level of said data related to the second channel with respect to the power level of the data related to the first channel, the relative power level of a signal representing data related to the first channel is adjusted by a gain factor.

13. The method of claim 8, wherein for changing the power level of said data related to the second channel with respect to the power level of the data related to the first channel, the relative power level of a signal representing data related to the first channel is adjusted by a first gain factor and the relative power level of a signal representing data related to the second channel is adjusted by a second gain factor.

14. A method for simultaneously transmitting data related to two channels using code division, comprising the steps of:

spreading data related to a first channel in parallel using a first spreading code and a second spreading code, spreading data related to a second channel in parallel using said first spreading code and said second spreading code, changing the power level of said data related to the second channel with respect to the power level of the data related to the first channel, and compiling a transmission from spread data related to the first channel and spread data related to the second channel the power level of which has been changed;

and wherein the compiled transmission consists of consecutive symbols, each of which takes a value from a set of allowed values represented as a group of constellation points, said constellation points being situated in the four quadrants of an IQ plane so that in each quadrant the constellation points lie symmetrically with respect to a diagonal intersecting the origin.

* * * * *